(12) United States Patent
Smith et al.

(10) Patent No.: US 6,372,662 B1
(45) Date of Patent: *Apr. 16, 2002

(54) METHOD OF OXIDIZING A SILICON SURFACE

(75) Inventors: Keith W. Smith; Charles E. Carver, both of Boise; Clarence J. Higdon, Meridian, all of ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/356,637

(22) Filed: Jul. 19, 1999

Related U.S. Application Data

(62) Division of application No. 08/936,676, filed on Sep. 24, 1997, now Pat. No. 5,989,718.

(51) Int. Cl.⁷ .............................................. H01L 21/31
(52) U.S. Cl. .................. 438/770; 438/255; 438/488; 438/482; 438/773; 438/787
(58) Field of Search ................................. 438/257, 488, 438/482, 496, 592, 593, 594, 622, 635, 761, 769, 770, 773, 787, 255

(56) References Cited

U.S. PATENT DOCUMENTS

| | | | |
|---|---|---|---|
| 4,943,538 A | 7/1990 | Mohsen et al. | 437/52 |
| 5,168,072 A | 12/1992 | Mosiehi | 437/41 |
| 5,326,722 A | 7/1994 | Huang | 437/186 |
| 5,362,665 A | * 11/1994 | Lu | 438/253 |
| 5,601,656 A | 2/1997 | Li | 134/2 |
| 5,696,014 A | * 12/1997 | Figura | 438/398 |
| 5,763,299 A | * 6/1998 | McCollum et al. | 438/131 |
| 5,795,806 A | * 8/1998 | Tseng | 438/255 |
| 5,877,063 A | * 3/1999 | Gilchrist | 438/398 |

* cited by examiner

*Primary Examiner*—Carl Whitehead, Jr.
*Assistant Examiner*—Maria Guerrero
(74) *Attorney, Agent, or Firm*—Workman, Nydegger & Seeley

(57) ABSTRACT

Disclosed is a process for forming, over a semiconductor substrate, a multilayer structure having successively a first layer of silicon-containing material, a relatively thin oxide layer, and a second layer of silicon-containing material. The oxide layer has a substantially uniform thickness in a range from about 1 Angstrom to about 20 Angstroms. The oxide layer consists essentially of silicon dioxide that is formed by exposing the first layer to an aqueous oxidizing bath at a relatively low temperature such that diffusion of dopants in the semiconductor substrate is not induced. The oxide layer prevents dopants from outgassing and diffusing out of the first layer and into the second layer. Also disclosed is a structure formed by the disclosed process.

27 Claims, 2 Drawing Sheets

METHOD OF OXIDIZING A SILICON SURFACE

This application is a divisional of U.S. patent application Ser. No. 08/936,676, filed on Sep. 24, 1997, which is incorporation herein by reference now U.S. Pat. No. 5,989,718.

BACKGROUND OF THE INVENTION

1. The Field of the Invention

The present invention relates to methods of forming a silicon-containing structure over a semiconductor substrate. More particularly, the present invention relates to a method of forming a multilayer structure having successively a first layer of silicon-containing material, a relatively thin layer of silicon dioxide, and a second layer of silicon-containing material.

2. The Relevant Technology

Integrated circuits are currently manufactured by an elaborate process in which semiconductor devices, insulating films, and patterned conducting films are sequentially constructed in a predetermined arrangement on a semiconductor substrate. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. The conventional semiconductor devices which are formed on the semiconductor wafer include capacitors, resistors, transistors, diodes, and the like. In advanced manufacturing of integrated circuits, hundreds of thousands of these semiconductor devices are formed on a single semiconductor substrate.

Integrated circuit manufacturing often requires formation of one layer of silicon-containing material over another layer of silicon-containing material. For convenience, an underlying silicon-containing layer will be referred to hereinafter as the first layer and an overlying silicon-containing layer will be referred to as the second layer. Frequently, the properties of a first layer will differ from those of a second layer in one or more important ways. For instance, the two layers may have different concentrations of dopants, thereby giving each layer different electrically conductive properties. The two layers may also have different crystalline structures, such as monocrystalline, polycrystalline, amorphous, cylindrical grain polysilicon, hemispherical grain, and spherical grain.

It is well understood that grain boundaries in highly doped, highly crystalline polysilicon facilitate outgassing and migration of dopants. It is surmised that diffusion of dopants is especially problematic when the dopants move into an adjacent second layer of silicon-containing material, thereby creating nonuniformities in the second layer. For example, a sheet resistance measurement taken at any particular point on the second layer may significantly depart from the average sheet resistance of the second layer. Dopant diffusion into adjacent layers may also cause a structure that contains the layers to having a nonuniform thickness.

It has been found that a silicon dioxide layer formed on the surface of a highly doped, highly crystalline polysilicon layer acts as diffusion barrier against outgassing of dopants. However, a layer of silicon dioxide can have undesirable consequences on a structure in which it is used. Techniques for forming a layer of silicon dioxide typically involve exposing a silicon layer to a thermal oxidation process, thereby heating not only the surface of the polysilicon layer, but also the semiconductor surface on which it lies. This heating sometimes induces diffusion of dopant material from active regions in the semiconductor substrate into adjacent previously undoped regions. Enlargement of active regions can cause inefficiency or failure of semiconductor devices. Moreover, conventional methods of forming silicon dioxide diffusion barriers produce silicon dioxide layers sufficiently thick to impair the conductivity of structures in which they are used.

What is needed is a method of forming an oxide layer upon a layer of doped silicon-containing material that adequately prevents diffusion and outgassing of dopants. A method is needed for forming an oxide layer sufficiently thin so as to not significantly reduce the conductivity of the structure in which it is used. It would also be advantageous to provide a method for forming an oxide layer that does not inherently expose nearby active regions of a semiconductor substrate to high temperatures.

SUMMARY OF THE INVENTION

The present invention relates to a process for forming a multilayer structure having successively a first layer of silicon-containing material, a relatively thin layer of silicon dioxide, and a second layer of silicon-containing material. Each of the first layer and the second layer of silicon-containing material is substantially composed of materials selected from the group consisting of monocrystalline silicon, polysilicon, amorphous silicon, spherical grain (BSG) polysilicon, and hemispherical grain (HSG) polysilicon. The oxide layer has a substantially uniform thickness in a range from about 1 Angstrom to about 20 Angstroms and consists essentially of silicon dioxide.

In one embodiment of the process, a first layer is formed over a semiconductor substrate. The first layer contains dopants, preferably in a high concentration in a range from about $5 \times 10^{19}$ atoms/cm to about $1 \times 10^{21}$ atoms/cm$^3$. An oxidation process is conducted on the first layer to form an oxide layer having a thickness between about 1 Angstrom and about 20 Angstroms. The preferred oxidation process uses an aqueous bath with an oxidizing agent bubbled therethrough. The aqueous bath preferably has a temperature in a range from about 0° C. to about 200° C. Finally, a second layer of silicon-containing material is formed upon the oxide layer. The oxide layer substantially prevents diffusion of dopants out of the first layer and into the second layer. It is surmised that the second layer is thereby protected from dopants that would otherwise diffuse thereinto and cause nonuniformities of various properties, including sheet resistivity and thickness. Preferably, the first layer, the oxide layer, and the second layer form a laminate having an average sheet resistance and having a plurality of points thereon, where the sheet resistance at each point is within 10% of said average sheet resistance. Alternatively, it is preferable that the second layer has a plurality of points thereon and has an average thickness, where the thickness at each point on the second layer is within 7% of the average thickness of the second layer.

In a second application of the invention, a first layer of silicon-containing material is positioned over a semiconductor substrate. A contact opening is cut through the first layer to extend to a contact surface on the semiconductor substrate. The first layer has an exposed surface including both of a sidewall that partially defines the contact opening and a top surface. An oxidation process is used to form an oxide layer on the exposed surface of the first layer. A second layer of silicon-containing material is formed upon the oxide layer, extending into the contact opening and to the contact surface. Again, the oxide layer substantially prevents diffusion of dopants out of the first layer and into the second layer.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are therefore not to be considered limiting of its scope, the invention will be described with additional specificity and detail through the use of the accompanying drawings in which.

DETAILED DESCRIPTION OF THE PREFERRED EMBODIMENTS

Figure 1:
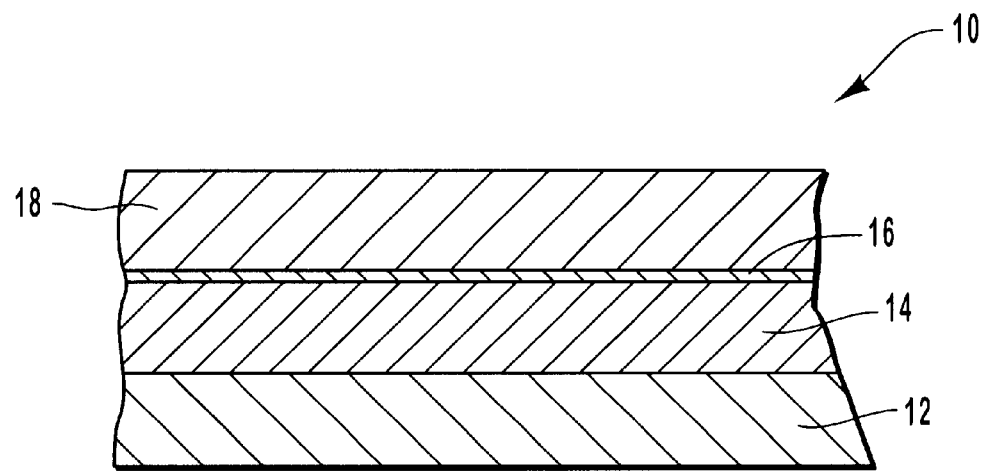
FIG. 1 is a partial cross-section elevation view of a structure having a thin oxide layer positioned between two silicon-containing layers.
Figure 2:
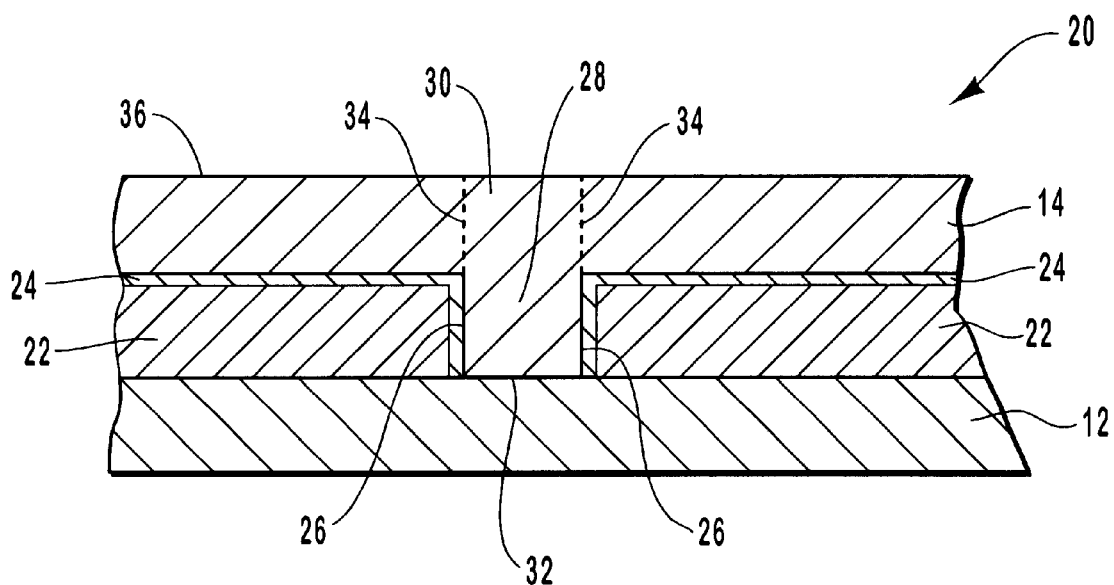
FIG. 2 is a partial cross-section elevation view of a structure having a first layer of silicon-containing material positioned over an electrically conductive layer and an electrically insulative layer.
Figure 3:
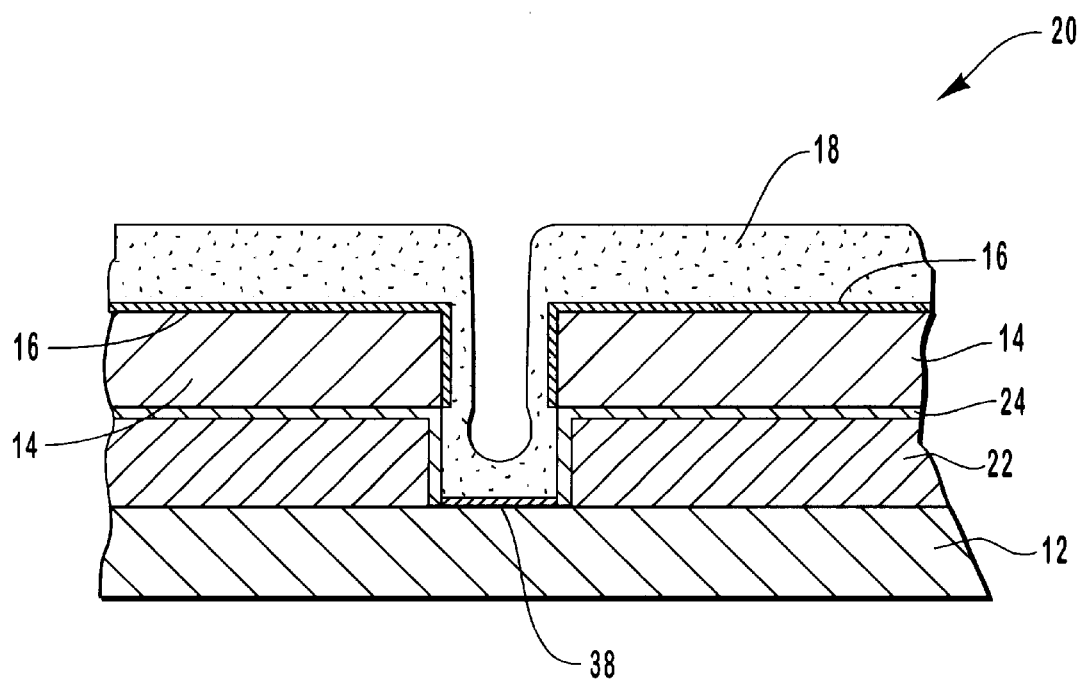
FIG. 3 is a partial cross-section elevation view of a structure of FIG. 2, further having an oxide layer, a contact opening extending to a semiconductor substrate, and a second layer of silicon-containing material.

The present invention relates to a process for forming a multilayer structure having successively a first layer of silicon-containing material, a relatively thin layer of silicon dioxide, and a second layer of silicon-containing material. FIG. 1 shows one application of the inventive process in which a structure is formed that has a thin silicon dioxide layer that substantially prevents diffusion and outgassing of dopants therethrough from a highly doped, highly crystalline polysilicon layer. FIGS. 2 and 3 illustrate another application which involves forming a structure having a thin layer of silicon dioxide disposed between two layers of silicon-containing material. The second layer extends into a contact opening that passes through the first layer. Again, the silicon dioxide layer substantially prevents diffusion and outgassing of dopants from the first layer into the second layer, as well as from the second layer through the first layer.

FIG. 1 illustrates a structure 10 having a first layer 14 of silicon-containing material that is formed over a semiconductor substrate 12. Semiconductor substrate 12 comprises a semiconductive material either alone or in an assembly comprising other materials including but not limited to monocrystalline silicon, silicon on sapphire, silicon on glass and silicon on insulator. The silicon-containing material of first layer 14 preferably consists essentially of elemental silicon. First layer 14 may be silicon of any crystalline structure, including, but not limited to amorphous, monocrystalline, polycrystalline, HSG, and CSG silicon. The method according to the invention is particularly advantageous when first layer 14 contains a highly doped, highly crystalline polysilicon material. For purposes of the invention, a highly doped silicon material is one having a dopant concentration in a range from about $5 \times 10^{19}$ atoms/$cm^3$ to about $1 \times 10^{21}$ atoms/$cm^3$. However, the first layer may be doped at a concentration greater or less than the above-specified range, and may be substantially undoped.

An oxide layer 16, having a thickness in a range between 1 Angstrom and 20 Angstroms is formed upon first layer 14. In the preferred embodiment of the invention, oxide layer 16 has a thickness of from about one to about nine molecules of silicon dioxide. Oxide layer 16 is formed preferably in an oxidizing process. By way of example, an oxidizing agent can be bubbled through an aqueous bath into which first layer 14 is submerged. Other oxidizing processes are contemplated, as well as other oxidizing agents including diatomic oxygen, ozone, and hydrogen peroxide. The oxidizing agent may also be any other reagent that induces formation of silicon dioxide on a silicon surface at temperatures less than 200° C. Oxide layer 16 is relatively uniform in that it covers and conforms to the surface of first layer 14 in an essentially unbroken layer.

A second layer 18 of silicon-containing material is next formed upon oxide layer 16. The silicon-containing material of second layer 18 preferably consists essentially of elemental silicon. Second layer 18 may be silicon of any crystalline structure, including, but not limited to monocrystalline, polycrystalline, amorphous, cylindrical grain polysilicon, hemispherical grain, and spherical grain.

In structure 10, oxide layer 16 is positioned between first layer 14 and second layer 18 such that it forms a barrier against diffusion and outgassing therethrough of any dopants contained in first and second layers 14, 18. Oxide layer 16 thereby substantially prevents influx of dopants into second layer 18 from first layer 14. Oxide layer 16 likewise forms a barrier against diffusion of dopants out of second layer 18 and into first layer 14.

In one variation of the embodiment illustrated in FIG. 1, semiconductor substrate 14 contains doped active regions (not shown) and undoped regions (not shown). As oxide layer 16 is formed, temperatures to which structure 10 is exposed are sufficiently low so as not to induce a diffusion of dopants from the doped active regions into the undoped regions of the semiconductor substrate.

FIG. 2 illustrates another preferred embodiment in which a structure 20 is formed over semiconductor substrate 12. An electrically conductive layer 22 preferably composed of materials such as refractory metal silicides, silicon containing semiconductor materials, GaAr containing semiconductor materials, and silicon containing materials having a structure that is monocrystalline, polycrystalline, amorphous, cylindrical grain polysilicon, hemispherical grain, and spherical grain. Electrically conductive layer 22 is formed over semiconductor substrate 12. An electrically insulative layer 24 is provided upon electrically conductive layer 22. Preferably, electrically insulative layer 24 comprises silicon dioxide, but may alternatively comprise silicon nitride or another suitable insulative material. Next, first layer 14 of silicon-containing material is positioned over electrically insulative layer 24 and preferably extends into a pattern 26 provided through electrically conductive layer 22. Alternatively, electrically conductive layer 22 and electrically insulative layer 24 may be omitted from structure 20, in which case first layer 14 is formed directly upon semiconductor substrate 12.

Silicon-containing material of first layer 14 is selectively removed by known means from region 30 (shown in phantom) that is substantially vertically aligned with pattern 26, thereby forming a contact opening 28 in first layer 14 and extending through pattern 26 to a contact surface 32 on semiconductor substrate 12. Contact opening 28 is defined by a sidewall 34 of first layer 14, pattern 26, and contact surface 32.

Referring to FIG. 3. oxide layer 16 having a thickness in a range from about 1 Angstrom and about 20 Angstroms is formed upon sidewall 34 and top surface 36 of first layer 14. Oxide layer 16 consists of silicon dioxide formed preferably in the oxidizing process described above with respect to FIG. 1. The oxidation process also forms a contact silicon dioxide layer 38 upon contact surface 32.

A second layer 18 of silicon-containing material is formed upon oxide layer 16. Second layer 18 is configured such that it extends into contact opening 28 and is disposed upon contact silicon dioxide layer 38. Oxide layer 16 is positioned between first layer 14 and second layer 18 such that it forms a barrier against diffusion and outgassing of any dopants contained in first layer 14. Oxide layer 16 thereby substantially prevents influx of dopants into second layer 18 from first layer 14. Oxide layer 16 likewise forms a barrier against diffusion of dopants out of second layer 18 and into first layer 14.

The present invention has application to methods of forming a wide variety of structures other than those specifically described herein. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A process for forming a silicon layer over a semiconductor substrate, said process comprising:
   forming a doped polysilicon layer over said semiconductor substrate;
   forming an oxide layer on said doped polysilicon layer, said oxide layer being about 3 Angstroms in uniform thickness of silicon dioxide; and
   forming an overlying silicon-containing layer upon said oxide layer, said oxide layer preventing diffusion of dopants from said doped polysilicon layer into said overlying silicon-containing layer.

2. A process as recited in claim 1, wherein said overlying silicon-containing layer is composed of amorphous silicon.

3. A process as recited in claim 1, wherein said overlying silicon-containing layer is composed of polysilicon.

4. A process as recited in claim 1, wherein forming said oxide layer comprises exposing said doped polysilicon layer to an oxidizing bath.

5. a process as recited in claim 1, wherein forming said oxide layer comprises exposing said doped polysilicon layer to an oxidizing agent formed from diatomic oxygen.

6. A process as recited in claim 1, wherein said doped polysilicon layer is doped with phosphorous.

7. A process as recited in claim 1, wherein said doped polysilicon layer is doped with arsenic.

8. A process for forming a silicon layer over a semiconductor substrate, said process comprising:
   forming a first layer over said semiconductor substrate, said first layer being composed of a material selected from the group consisting of polysilicon, hemispherical grain silicon, spherical grain silicon, amorphous silicon, and monocrystalline silicon;
   forming an oxide layer upon said first layer having a thickness in a range from about 1 Angstrom to about 20 Angstroms; and
   forming a second layer upon said oxide layer, said second layer being composed of a material selected from the group consisting of polysilicon, hemispherical grain silicon, spherical grain silicon, cylindrical grain polysilicon, amorphous silicon, and monocrystalline silicon.

9. A process as recited in claim 8, wherein said oxide layer has a thickness in a range from about 3 Angstroms to about 15 Angstroms.

10. A process as recited in claim 8, wherein said semiconductor substrate comprises silicon on sapphire.

11. A process as recited in claim 8, wherein said semiconductor substrate comprises silicon on insulator.

12. A process as recited in claim 8, wherein said semiconductor substrate comprises silicon on glass.

13. A process for forming a structure over a semiconductor substrate, said process comprising:
   forming a first layer over said semiconductor substrate, said first layer being composed of a material selected from the group consisting of polysilicon, hemispherical grain silicon, spherical grain silicon, amorphous silicon, and monocrystalline silicon;
   forming an oxide layer upon said first layer having a thickness in a range from about 1 Angstrom to about 20 Angstroms; and
   forming a second layer upon said oxide layer, said second layer being composed of a material selected from the group consisting monocrystalline silicon, polycrystalline silicon, amorphous silicon, cylindrical grain polysilicon, hemispherical grain silicon, and spherical grain silicon, wherein said first layer, said oxide layer, and said second layer form a laminate having an average sheet resistance and having a plurality of points each of which has a sheet resistance with 10% of said average sheet resistance.

14. A process for forming a silicon layer over a semiconductor substrate, said process comprising:
   forming a first layer over said semiconductor substrate, said first layer being composed of a material selected from the group consisting of monocrystalline silicon, polycrystalline silicon, amorphous silicon, cylindrical grain polysilicon, hemispherical grain silicon, and spherical grain silicon;
   forming an oxide layer upon said first layer having a thickness in a range from about 1 Angstrom to about 20 Angstroms; and
   forming a second layer upon said oxide layer, said second layer being composed of a material selected from the group consisting of polysilicon, hemispherical grain silicon, spherical grain silicon, amorphous silicon, and monocrystalline silicon, said second layer having a plurality of points thereon, wherein thickness measurements at each said point on said second layer is within 7% of an average thickness of said second layer.

15. A process for forming a silicon layer over a semiconductor substrate, said process comprising:
   providing a semiconductor substrate containing a dopant material positioned at first and second separate and identical active regions in said semiconductor substrate;
   forming a first layer of silicon-containing material over said semiconductor substrate;
   oxidizing said first layer of silicon-containing material to form an oxide layer upon said first layer of silicon-containing material, said oxide layer having a thickness in a range from about 1 Angstrom to about 20 Angstroms, wherein, after said oxidation of said first layer of silicon-containing material, said first and second active region of said semiconductor substrate are identical and unchanged by said oxidizing of said first layer of silicon-containing material; and forming a second layer of silicon-containing material upon said oxide layer.

16. A process for forming a polysilicon layer over a semiconductor substrate, said process comprising:

providing a semiconductor substrate including a monocrystalline silicon layer that has an exposed surface;

forming an oxide layer having a uniform thickness in a range from about 1 Angstrom to about 20 Angstroms upon said exposed surface of said monocrystalline silicon layer by exposing said monocrystalline silicon layer by exposing said monocrystalline silicon layer to an oxidizer including at least one oxidizing agent selected from the group consisting of diatomic oxygen, ozone, and hydrogen peroxide, wherein said oxide layer is formed in an oxidizing process conducted at a temperature less than about 2000° C., and forming a polysilicon layer upon said oxide layer.

17. A process as recited in claim 16, wherein said oxide layer has a thickness in a range from about 3 Angstroms to about 15 Angstroms.

18. A process as recited in claim 16, wherein said process forms a structure comprising each of said monocrystalline silicon layer, said oxide layer, and said polysilicon layer, said structure having an average sheet resistance, said structure further having sheet resistance measurements at each point on said structure, all of which are within 10% of said average sheet resistance.

19. A process for forming a silicon layer over a semiconductor substrate, said process comprising:

forming a first polysilicon layer over said semiconductor substrate, said first polysilicon layer having an exposed top surface, said first polysilicon layer being doped with dopants at a concentration in a range from about $5\times10^{19}$ atoms/cm$^3$ to about $1\times10^{21}$ atoms/cm$^3$;

forming a contact opening through said first polysilicon layer, said contact opening being defined in part by both of a contact surface on said semiconductor substrate and a sidewall surface of said first polysilicon layer;

forming an oxide layer having a uniform thickness in a range from about 1 Angstrom to about 20 Angstroms on each of:

said contact surface;

said exposed top surface of said first polysilicon layer; and said sidewall surface of said first polysilicon layer, wherein said oxide layer is formed by exposing both of said first polysilicon layer and said contact surface to an oxidizer including at least one oxidizing agent selected from the group consisting of diatomic oxygen, ozone, and hydrogen peroxide, said oxide layer being formed in an oxidizing process being conducted at a temperature less than about 2000° C.; and forming a second polysilicon layer upon said oxide layer, said second polysilicon layer covering said contact surface and said sidewall surface.

20. A process as recited in claim 19, further comprising, before forming said first polysilicon layer:

providing an electrically conductive layer upon said semiconductor substrate; and providing an electrically insulative layer upon said electrically conductive layer.

21. A process as recited in claim 19, wherein said oxide layer prevents diffusion of said dopants from said first polysilicon layer into said second polysilicon layer.

22. A process as recited in claim 19, wherein said oxide layer has a thickness in a range from about 3 Angstroms to about 15 Angstroms.

23. A process as recited in claim 19, wherein said first polysilicon layer, said oxide layer, and said second polysilicon layer form a laminate having an average sheet resistance and having a plurality of points, wherein each said point has a sheet resistance within 10% of said average sheet resistance.

24. A process for forming a silicon layer over a semiconductor substrate, said process comprising:

forming a doped polysilicon layer over said semiconductor substrate;

forming an oxide layer on said doped polysilicon layer, said oxide layer being about 3 Angstrom in uniform thickness of silicon dioxide; and forming an overlying silicon-containing layer upon said oxide layer, said oxide layer preventing diffusion of dopants from said doped polysilicon layer into said overlying silicon-containing layer, and said overlying silicon-containing layer comprising at least one of cylindrical grain silicon, monocrystaline silicon, hemispherical grain silicon, spherical grain silicon, and combinations thereof.

25. A process for forming a silicon layer over a semiconductor substrate, said process comprising:

forming a doped polysilicon layer over said semiconductor substrate;

forming an oxide layer on said doped polysilicon layer, said oxide layer being about 3 Angstroms in uniform thickness of silicon dioxide, wherein forming said oxide layer comprises exposing said doped polysilicon layer to an oxidizing agent formed from at least one of ozone, hydrogen peroxide, and combinations thereof; and forming an overlying silicon-containing layer upon said oxide layer, said oxide layer preventing diffusion of dopants from said doped polysilicon layer into said overlying silicon-containing layer.

26. A process for forming a silicon layer over a semiconductor substrate, said process comprising:

forming a doped polysilicon layer over said semiconductor substrate;

forming an oxide layer on said doped polysilicon layer, said oxide layer being about 3 Angstroms in uniform thickness of silicon dioxide, wherein forming said oxide layer comprises exposing said doped polysilicon layer to an aqueous solution containing an oxidizing agent in an oxidation process conducted at a temperature less than about 200° C.; and forming an overlying silicon-containing layer upon said oxide layer, said oxide layer venting diffusion of dopants from said doped polysilicon layer into said overlying silicon-containing layer.

27. A process for forming a silicon layer over a semiconductor substrate, said process comprising:

forming a doped polysilicon layer over said semiconductor substrate, wherein said polysilicon layer is doped with boron;

forming an oxide layer on said doped polysilicon layer, said oxide layer being about 3 Angstroms in uniform thickness of silicon dioxide; and forming an overlying silicon-containing layer upon said oxide layer, said oxide layer preventing diffusion of dopants from said doped polysilicon layer into said overlying silicon-containing layer.

* * * * *

UNITED STATES PATENT AND TRADEMARK OFFICE
CERTIFICATE OF CORRECTION

PATENT NO. : 6,372,662 B1
DATED : April 16, 2002
INVENTOR(S) : Keith W. Smith, Charles E. Carver and Clarence J. Higdon It is certified that error appears in the above-identified patent and that said Letters Patent is hereby corrected as shown below:

Column 1,
Line 63, before "layers" delete "the"
Line 63, after "layers" delete "to"

Column 2,
Line 42, before "to about" change "atoms/cm" to -- $atoms/cm^3$ --

Column 5,
Line 54, before "process" change "a" to -- A --

Column 7,
Line 20, after "about" change "2000º C.," to -- 200º C., --
Line 55, after "about" change "2000º C.," to -- 200º C.; --

Column 8,
Line 15, before "in uniform" change "Angstrom" to -- Angstroms --
Line 51, before "diffusion" change "venting" to -- preventing --

Signed and Sealed this

Seventeenth Day of December, 2002

JAMES E. ROGAN
*Director of the United States Patent and Trademark Office*